United States Patent
Leung

(10) Patent No.: US 6,256,248 B1
(45) Date of Patent: *Jul. 3, 2001

(54) METHOD AND APPARATUS FOR INCREASING THE TIME AVAILABLE FOR INTERNAL REFRESH FOR 1-T SRAM COMPATIBLE DEVICES

(75) Inventor: Wingyu Leung, Cupertino, CA (US)

(73) Assignee: Monolithic System Technology, Inc., SunnyvaLE, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/590,943

(22) Filed: Jun. 9, 2000

Related U.S. Application Data

(63) Continuation of application No. 09/181,840, filed on Oct. 27, 1998, now Pat. No. 6,075,740.

(51) Int. Cl.[7] .................................................. G11C 8/00
(52) U.S. Cl. .................... 365/222; 365/233; 365/189.05; 365/189.07
(58) Field of Search ................................... 356/222, 233, 356/189.05, 189.07

(56) References Cited

U.S. PATENT DOCUMENTS

| | | |
|---|---|---|
| 4,330,852 | 5/1982 | Redwine et al. . |
| 4,999,814 | 3/1991 | Hashimoto . |
| 5,450,364 | 9/1995 | Stephens, Jr. et al. . |
| 5,659,515 | * 8/1997 | Matsuo et al. ........................ 365/222 |
| 5,721,862 | 2/1998 | Sartore et al. . |
| 5,748,547 | 5/1998 | Shau . |
| 5,784,705 | 7/1998 | Leung . |
| 5,829,026 | 10/1998 | Leung . |
| 5,875,452 | * 2/1999 | Katayama et al. ............... 365/233 X |

* cited by examiner

Primary Examiner—Huan Hoang
(74) Attorney, Agent, or Firm—Bever, Hoffman & Harms, LLP; E. Eric Hoffman

(57) ABSTRACT

A memory system including a DRAM array, a read buffer, a write buffer and an input/output (I/O) interface. The read buffer and write buffer are coupled between the DRAM array and the I/O interface. When an external transaction involves multiple pieces of data in consecutive address locations, such as a burst access, parallel operations are performed in the DRAM array and the I/O interface. In a burst read transaction, all the data in the burst transaction is pre-fetched from the DRAM memory into the read buffer in one memory cycle. After the read data has been pre-fetched, the DRAM array is available for a refresh operation. The DRAM array can therefore be refreshed while the burst read data is sequentially transferred from the read buffer to the I/O interface. In a burst write transaction, multiple burst write data values are written to the write buffer over multiple I/O cycles. This burst write data is not retired to the DRAM array until the next write transaction. At this time, all of the burst write data is simultaneously retired to the DRAM array. As a result, the DRAM array is only engaged in the burst write transaction for one memory cycle. Because the DRAM array is not engaged in the transfer of the new data values from the I/O interface to the write buffer, the DRAM array can be refreshed during one or more of the remaining three I/O cycles.

20 Claims, 9 Drawing Sheets

METHOD AND APPARATUS FOR INCREASING THE TIME AVAILABLE FOR INTERNAL REFRESH FOR 1-T SRAM COMPATIBLE DEVICES

This application is a continuation of application Ser. No. 09/181,840 filed Oct. 27, 1998 now U.S. Pat. No. 6,075,740.

FIELD OF THE INVENTION

The present invention is applicable to semiconductor memories that must be periodically refreshed, such as dynamic random access memory (DRAM). More specifically, the present invention relates to a structure and method for increasing the amount of time available for performing internal refresh operations within a memory by performing refresh operations during burst access operations.

DISCUSSION OF RELATED ART

Many prior art memory systems use read and write buffers in connection with RAM arrays. One such memory system is described in U.S. patent application Ser. No. 08/679,873, entitled "Method and Structure For Performing Pipeline Burst Accesses In a Semiconductor Memory", by Wingyu Leung. This memory system uses read and write buffers to enable the bit lines and sense amplifications in the RAM array to begin pre-charging before a burst read or write transaction is finished. The early pre-charge operation prepares the RAM array for the next transaction and thereby reduces the access time of the memory system.

Another memory system using read and write buffers in connection with a RAM array is described in U.S. patent application Ser. No. 08/812,000, entitled "Method and Structure for Implementing a Cache Memory Using A DRAM Array", by Wingyu Leung. This memory system uses read and write buffers to bridge the bandwidth and transfer discrepancy between a RAM array and an external system accessing the memory system.

In both of the memory systems described above, the RAM array is not refreshed in parallel with the transfer of data to and from the RAM array.

Other conventional memory systems use a cache memory in connection with a DRAM array. One such memory system is described by K. Dosaka, et. al in "A 100 MHz 4 mb Cache DRAM with Fast Copy-Back Scheme", Digest of ISSCC, pp. 148–149 (1992). In this memory system, a small SRAM cache having a relatively short access time is used in connection with a main DRAM array. The SRAM cache is controlled to reduce the average access time of the memory system. The SRAM cache is not used to allow more time for internal memory refresh operations. The access time of the memory system varies depending on the hit rate of the SRAM cache. In addition, this memory system requires external control for memory refresh operations.

Another conventional memory system is described in "131,072-Word by 8-Bit CMOS Pseudo Static RAM", Toshiba Integrated Circuit Technical Data (1996). This memory system attempts to use a DRAM array for SRAM applications. However, the DRAM array must be periodically refreshed. In this memory system, the DRAM array cannot be refreshed during an external access, because the DRAM array is busy. This memory system requires an external signal for controlling the refresh of the DRAM array. External accesses are delayed during refresh operations. As a result, the refresh operations are not transparent and the memory system cannot be fully compatible with an SRAM device.

Another conventional memory system is described by K. Ayukawa, et. al, in "An Access-Sequence Control Scheme to Enhance Random-Access Performance of Embedded DRAM's", IEEE JSSC, vol. 33, no. 5, May 1998. This memory system uses a write buffer to speed up the write access in an embedded DRAM. In this memory system the DRAM cycle time takes multiple clock periods and there is no mention of performing refresh operations in parallel with I/O data transfer to an external device.

It would therefore be desirable to have a memory system that controls the operation of a DRAM array in a manner that provides additional time for the DRAM array to be refreshed.

SUMMARY

The present invention therefore provides a memory system that includes a DRAM array, a read buffer, a write buffer and an input/output (I/O) interface. The read buffer and write buffer are coupled between the DRAM array and the I/O interface. When an external transaction involves multiple pieces of data in consecutive address locations, such as a burst access, parallel operations are performed in the DRAM array and the I/O interface.

In a burst read transaction, all the data in the burst transaction is pre-fetched from the DRAM memory into the read buffer in one memory cycle. After the read data has been pre-fetched, the DRAM array is available for a refresh operation. The DRAM array can therefore be refreshed while the burst read data is sequentially transferred from the read buffer to the I/O interface. In one example, four data words are pre-fetched from the DRAM array to the read buffer during a first memory cycle. One of these four data words is transferred to the I/O interface during this first memory cycle, and the other three data words are sequentially transferred to the I/O interface during the next three memory cycles. Because the DRAM array is not engaged in the transfer of data values from the read buffer to the I/O interface, the DRAM array can be refreshed during these next three memory cycles.

In a burst write transaction, multiple burst write data values are written to the write buffer over multiple I/O cycles. This burst write data is not retired to the DRAM array until the next write transaction. At this time, all of the burst write data is simultaneously retired to the DRAM array. In one example, four data words are written to the write buffer over four I/O cycles during a first write burst transaction. During a second write burst transaction, these four data words are simultaneously retired to the DRAM array during a first I/O cycle. Also during the second write burst transaction, four new data words are written to the write buffer over four I/O cycles. As a result, the DRAM array is only engaged in the burst write transaction for one memory cycle. Because the DRAM array is not engaged in the transfer of the new data values from the I/O interface to the write buffer, the DRAM array can be refreshed during one or more of the remaining three I/O cycles.

Because the read and write buffers are controlled to limit the time that the DRAM array is engaged in a burst read or burst write transaction to one memory cycle, the available time for refreshing the DRAM array is maximized. Moreover, reducing the time that the DRAM array is engaged in read and write transactions significantly reduces the operating power of the memory system, since most of the power is consumed by the operation of the DRAM array.

The present invention also includes a comparator that is coupled to receive a current access address and an address associated with the data stored in the write buffer. Upon detecting a match between these two addresses, the comparator asserts a HIT control signal. If the current access is a read transaction, the asserted HIT control signal indicates that data required by the read transaction is stored in the write buffer, and has not yet been retired to the DRAM array. Under these conditions, write buffer control circuitry accesses the write buffer to retrieve the data required by the read transaction, thereby ensuring that coherent data is provided during the read transaction. In one embodiment, data from the write buffer and data from the DRAM array is merged onto an internal data bus using a maskable write driver circuit.

The present invention will be more fully understood in view of the following description and drawings.

DETAILED DESCRIPTION

Figure 1:
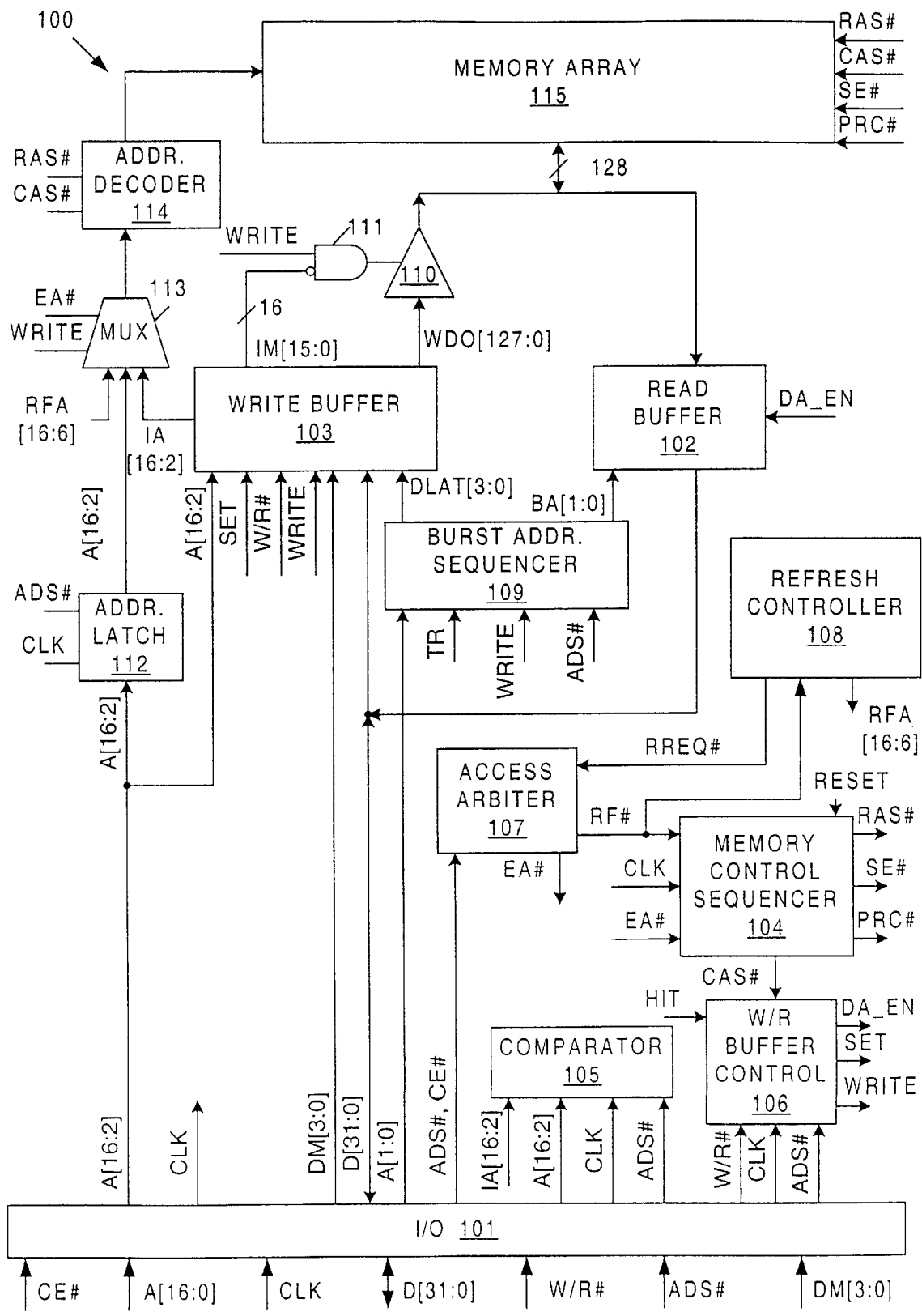
FIG. 1 is a block diagram of a memory system in accordance with one embodiment of the present invention.

FIG. 1 is a block diagram of a memory system 100 in accordance with one embodiment of the present invention. Memory system 100 includes I/O interface 101, read buffer 102, write buffer 103, memory control sequencer 104, comparator 105, write/read buffer control circuit 106, access arbiter 107, refresh controller 108, burst address sequencer 109, selectable write driver 110, AND gate 111, address latch 112, multiplexer 113, address decoder 114 and memory array 115. In the described embodiment, memory array 115 is an array of DRAM cells. However, it is understood that memory array 115 can include any array of memory cells that must be periodically refreshed.

In general, a read transaction is performed by transferring 128 bits of data from memory array 115 to read buffer 102 during a first memory cycle. If the read transaction is a burst transaction, then the data stored in read buffer 102 is transferred to I/O interface 101 on a 32-bit wide internal data bus over a plurality of memory cycles. For example, if the burst read transaction has a burst length of four, then four 32-bit words are transferred from read buffer 102 to I/O interface 101 over four successive memory cycles. Similarly, if the burst read transaction has a burst length of two, then two 32-bit words are transferred from read buffer 102 to I/O interface over two successive memory cycles. Because memory array 115 is only engaged in the transfer of data during the first memory cycle, memory array 115 is free to implement a refresh operation during any of the subsequent burst cycles In general, a burst write transaction is performed by sequentially transferring a plurality of 32-bit words from I/O interface 101 to write buffer 103 during a plurality of memory cycles. For example, if the burst write transaction has a burst length of four, then four 32-bit words are transferred from I/O interface 101 to write buffer 103 over four successive memory cycles. These four 32-bit words are stored in write buffer 103 until the next write transaction. During this next write transaction, the data previously written to write buffer 103 is transferred from write buffer 103 to memory array 115 in a single memory cycle. Also during this next write transaction, four new 32-bit words are transferred from I/O interface 101 to write buffer 103 over four successive memory cycles. Thus, a burst write transaction involving four data values only engages memory array 115 for a single memory cycle. Because memory array 115 is only engaged in the transfer of data during a single memory cycle, memory array 115 is free to implement a refresh operation during the other three memory cycles of the burst write transaction.

In this manner, memory system 100 minimizes the amount of time that memory array 115 is engaged in read and write access transactions, thereby minimizing the power consumption of memory system 100 and maximizing the amount of time available to perform refresh operations within memory array 115.

Memory system 100 will now be described in more detail. In the described embodiment, memory array 115 is a conventional DRAM array having 2048 row and 2048 columns of DRAM cells, and has a word size of 32-bits. Thus, memory array 115 is a 128K×32memory. Each 32-bit word includes four 8-bytes. Read and write operations are performed within memory array 115 in response to a row access strobe signal (RAS#), a column access strobe signal (CAS#), a sense amplifier enable signal (SE#), and a pre-charge signal (PRC#). These signals are generated by memory control sequencer 104. In general, memory control sequencer 104 generates the RAS#, CAS#, SE# and PRC# signals at predetermined times during a single cycle of a clock signal (CLK). The duration of an operation within memory array 115 is therefore one cycle of the CLK signal. The functionality of the RAS#, CAS#, SE# and PRC# signals and the operation of memory control sequencer 104 are described in more detail in commonly owned, co-pending U.S. patent application Ser. No. 09/076,608, filed May 12, 1998 by Wingyu Leung entitled "Method and Structure for Controlling Internal Operations of a DRAM ARRAY", which is hereby incorporated by reference in its entirety.

Memory array 115 receives row and column select signals from address decoder 114, whose timing is controlled by the RAS# and CAS# signals. Address decoder 114 provides the row and column select signals in response to an access address received from address multiplexer 113. As described in more detail below, address multiplexer 113 provides the access address from one of three sources in response to an external access signal (EA#) and a write control signal (WRITE). More specifically, address multiplexer 113 routes one of the following access addresses: refresh address RFA[16:6], external address A[16:2] or internal address IA[16:2]. Refresh address RFA[16:6] is provided by refresh controller 108, external address A[16:2] is provided by address latch 112, and internal address IA[16:2] is provided by write buffer 103.

In general, data is transferred to and from memory array 115 on a 128-bit wide internal data bus. This internal data bus is coupled to read buffer 102 and write buffer 103 in parallel. The 128-bit internal data bus allows four 32-bit data words to be simultaneously transferred from memory array 115 to read buffer 102. Similarly, the 128-bit internal data bus allows four 32-bit data words to be simultaneously transferred from write buffer 103 to memory array 115 (through maskable write driver circuit 110).

I/O interface 101 provides buffering between internal and external signals. The external signals provided to memory system 100 include clock signal CLK, data signals D[31:0], address signals A[16:0], write/read enable signal W/R#, address strobe signal ADS#, data mask signal DM[3:0] and chip enable signal CE#. I/O interface 101 routes these external signals to the various elements of memory system 100 as illustrated. In general, the CLK signal facilitates synchronization of communication between memory system 100 and the external accessing device. Data signals D[31:0] represent the data associated with a read or write access transaction. Data signals D[31:0] are transferred between I/O interface 101, read buffer 102 and write buffer 103 on a 32-bit bi-directional internal data bus. Address signals A[16:2] define an access address within memory array 115, while address signals A[1:0] define a burst sequence. The write/read enable signal W/R# has a logic high state to identify a write transaction, and a logic low state to identify a read transaction. The address strobe signal ADS# is asserted low to identify the beginning of an external access transaction, and the chip enable signal CE# is asserted low to enable memory system 100. Finally, the write mask signals DM[3:0] facilitate byte-level data write access transactions. These signals are described in more detail below.

An external access transaction begins when access arbiter 107 detects that the chip enable signal CE# and the address strobe signal ADS# are asserted low at the rising edge of the clock signal CLK. Access arbiter 107 arbitrates between external access transactions and internal refresh requests. Access arbiter 107 grants priority to external access transactions. When an external access transaction is detected, access arbiter 107 drives the external access enable signal EA# low, thereby enabling memory control sequencer 104 to initiate a read pre-fetch operation or a write data retiring operation as described in more detail below.

Refresh controller 108 periodically asserts a logic low refresh request signal RREQ# signal to initiate an internal refresh transaction. The refresh request signal RREQ# is asserted low unit refresh controller 108 receives a logic low refresh enable signal RF# from access arbiter 107. In the described embodiment, refresh controller 108 periodically asserts the refresh request signal RREQ# once every 1000 clock cycles, or once every 8 $\mu$sec. Refresh controller 108 also generates a refresh address signal RFA[16:6], which identifies one of the 2048 rows of memory array 115. Refresh address RFA[16:6] is incremented each time the refresh request signal RREQ# is asserted low, such that a different row is refreshed for each refresh access. Refresh address RFA[16:6] is provided to address multiplexer 113 as illustrated. In the described embodiment, a refresh transaction consists of performing a read access of memory array 115, wherein the memory calls in the accessed row are incidentally refreshed by the read access.

The refresh request signal RREQ# is provided to access arbiter 107. Access arbiter 107 initiates an internal refresh cycle by asserting a refresh enable signal RF# low when the external access enable signal EA# is de-asserted high and the refresh request signal RREQ# is asserted low. That is, access arbiter 107 initiates a refresh cycle when a refresh request is pending and no external transaction is pending. The logic low refresh enable signal RF# causes memory control sequencer 104 to initiate a refresh access (i.e., a read access). The logic low refresh enable signal RF# is also provided to refresh controller 108, thereby providing an acknowledgement that the refresh access has been performed. Refresh controller 108 resets the refresh request signal RREQ# to a logic high level in response to the logic low refresh enable signal RF#.

Access arbiter 107 and refresh controller 108 are described in more detail in commonly-owned, co-pending U.S. patent application Ser. No. 09/037,396 filed on Mar. 9, 1998 by Wingyu Leung entitled "Method and Apparatus For 1-T SRAM Compatible Memory", which is hereby incorporated by reference in its entirety.

As described in more detail below, W/R buffer control circuit 106 generates the DA_EN, SET and WRITE control signals in response to the W/R#, CLK, ADS# and CAS# signals. The DA_EN control signal is a data enable signal that is used to latch data into read buffer 102. The SET control signal is used to reset a data mask in write buffer 103 at the beginning of each write transaction. The WRITE control signal is used to latch data into write buffer 103 and to control bust address sequencer 109, AND gate 111 and address multiplexer 113. The WRITE control signal is activated high when the ADS# signal is low, the CLK signal is high and the W/R# signal is high, or when the HIT signal generated by comparator 105 is high.

Write Buffer

Figure 2:
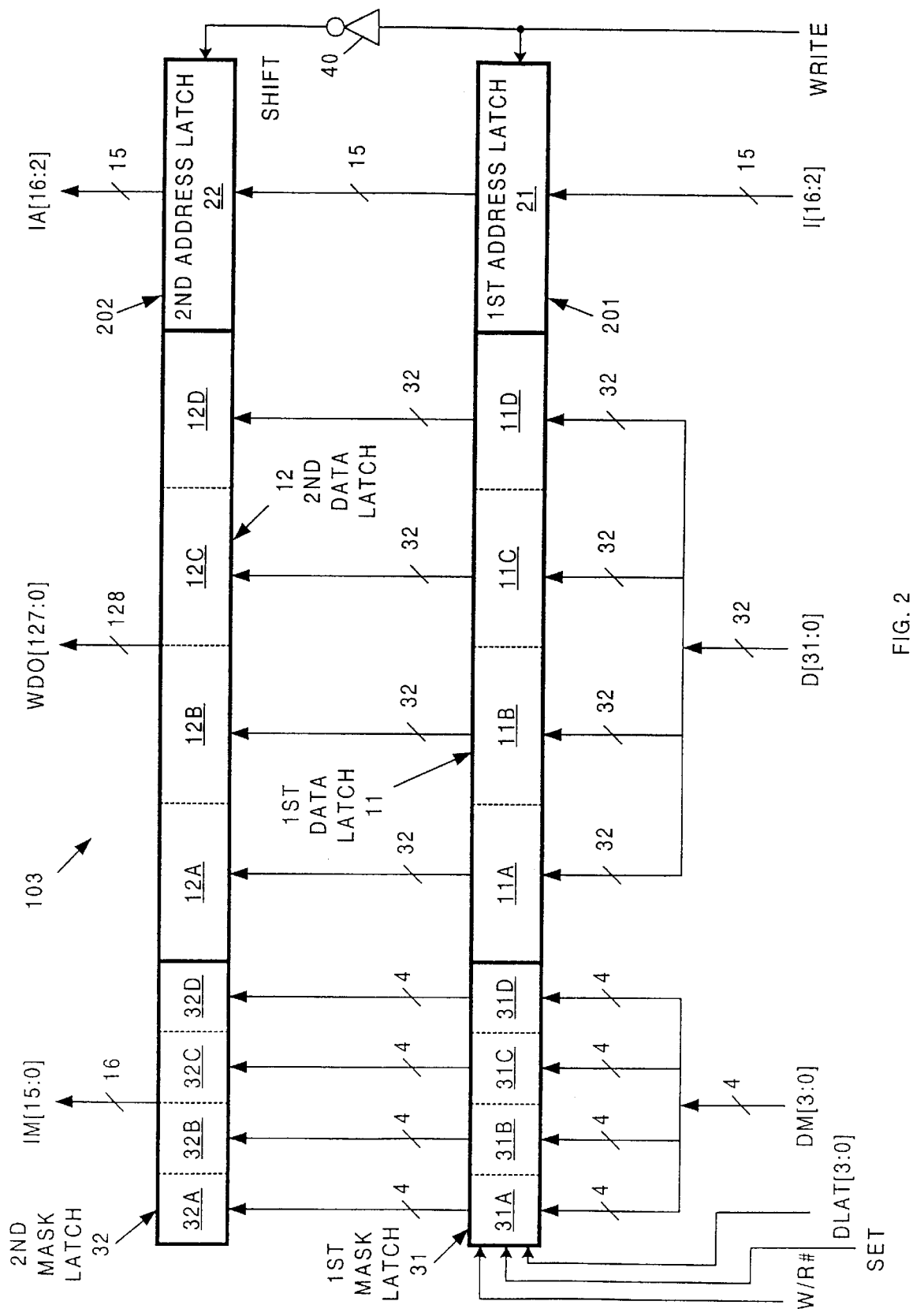
FIG. 2 is a block diagram of a write buffer in accordance with one embodiment of the present invention.

FIG. 2 is a block diagram of write buffer 103, which includes first latch circuit 201 for storing a first entry and second latch circuit 202 for storing a second entry. First latch circuit 201 includes first data mask latch 31 for storing a 16-bit wide data mask entry, first data latch 11 for storing a 128-bit wide data entry, and first address latch 21 for storing a 15-bit wide address entry. Similarly, second latch circuit 202 includes second data mask latch 32 for storing a 16-bit wide data mask entry, second data latch 12 for storing a 128-bit wide data entry, and second address latch 22 for storing a 15-bit wide address entry.

The first and second latch circuits 201 and 202 are configured to form a 2-deep first in, first out (FIFO) memory. The first latch circuit 201 is dedicated for storing data, mask and address values of a current write transaction, while the second latch circuit 202 is dedicated for storing data, mask and address values of a previous write transaction to be retired to memory array 115. In general, first and second latch circuits 201 and 202 are latches that are transparent when receiving a logic high control signal, and which latch in response to a logic low control signal.

Within first latch circuit 201, first data latch 11 is logically partitioned into four entries 11A, 11B, 11C, and 11D, with each entry storing 32 bits. Each of these four entries is connected in parallel to receive the data value D[31:0] from the 32-bit internal data bus. First data latch 11 also receives 4-bit select signals DLAT[3:0] from burst address sequencer 109, and the W/R# control signal from I/O interface 101.

Within second latch circuit 202, second data latch 12 is logically partitioned into four entries 12A, 12B, 12C and 12D, with each entry storing 32 bits. The contents of entries 11A–11D in first data latch 11 are routed to entries 12A–12D, respectively, in second data latch 12. Second data latch 12 also receives the SHIFT control signal from inverter 40.

Figure 3:
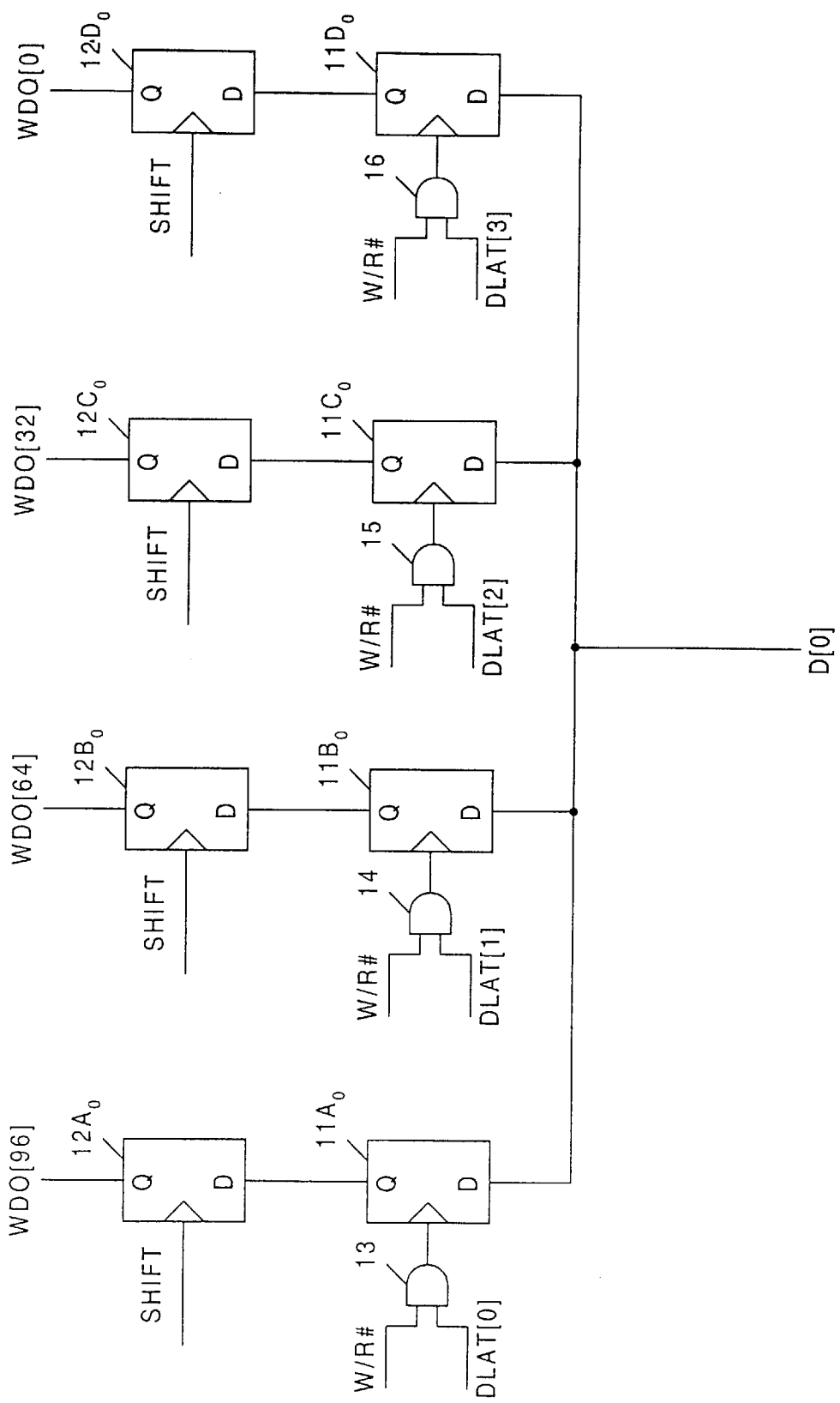
FIG. 3 is a schematic diagram illustrating bit slices of data entries of the write buffer of FIG. 2.

FIG. 3 is a schematic diagram illustrating a bit slice of each of entries 11A–11D and 12A–12D. These bit slices are formed by AND gates 13–16 and registers $11A_0$, $11B_0$, $11C_0$, $11D_0$, $12A_0$, $12B_0$, $12C_0$ and $12D_0$. For example, the bit slice of entries 11A and 12A is formed by AND gate 13 and registers $11A_0$ and $12A_0$. Each of registers $11A_0$, $11B_0$, $11C_0$ and $11D_0$ is coupled to receive a data bit (e.g., D[0]) from the 32-bit internal data bus D[31:0]. Registers $11A_0$, $11B_0$, $11C_0$ and $11D_0$ are further coupled to receive latch enable signals from AND gates 13–16, respectively. Each of AND gates 13–16 has an input terminal coupled to receive the W/R# control signal. The other input terminals of AND gates 13–16 are coupled to receive the data latch signals DLAT[0], DLAT[1], DLAT[2] and DLAT[3], respectively. The output terminals of registers $11A_0$, $11B_0$, $11C_0$ and $11D_0$ are coupled to the input terminals of registers $12A_0$, $12B_0$, $12C_0$ and $12D_0$, respectively. Data values are latched into registers $12A_0$, $12B_0$, $12C_0$ and $12D_0$ in response to the SHIFT signal. Registers $12A_0$, $12B_0$, $12C_0$ and $12D_0$ provide data output signals WDO[96], WDO[64], WDO[32] and WDO[0], respectively. The other bit slices in first and second latches 11 and 12 are connected in the same manner as the bit slices illustrated in FIG. 3. All of the registers in entry 11A are controlled by the control signal provided by AND gate 13. Similarly, all of the registers in entries 11B, 11C and 11D are controlled by the output signals provided by AND gates 14, 15 and 16, respectively.

During a burst write transaction, the bit slices of FIG. 3 are controlled as follows. During the write transaction, the W/R# signal is asserted high, thereby providing a logic high input to each of AND gates 13–16. The burst address sequencer 109 receives the lower address bits A[1:0], a logic high WRITE control signal and a logic low ADS# signal, and in response, sequentially asserts the DLAT[3:0] control signals in an order determined by the lower address bits A[1:0]. For example, during a first burst write cycle, the DLAT[0] signal can be asserted high. Under these conditions, AND gate 13 provides a logic high signal to register $11A_0$, thereby causing the data bit D[0] to be latched into register $11A_0$. At the same time, the other 31 data bits D[31:1] are latched into the other bit slices of entry 11A.

During a second memory cycle, burst address sequencer 109 asserts another one of the DLAT[3:0] control signals, for example, the DLAT[1] control signal. Under these conditions, AND gate 14 provides a logic high signal to register $11B_0$, thereby causing the data bit D[0] of a second data value to be latched into register $11B_0$. At the same time, the other 31 data bits D[31:1] of the second data value are latched into the other bit slices of entry 11B. This procedure is repeated until data values are written into each of the four entries 11A, 11B, 11C and 11D of first data latch 11. If the write transaction involves less than four data words, then the above-described process is stopped after the desired number of words have been written to first data latch 11.

First mask latch 31 is logically partitioned into four entries 31A, 31B, 31C, and 31D, with each entry storing 4 bits. Each of these four entries is connected in parallel to receive the data mask signals DM[3:0] from I/O interface 101. First mask latch 31 also receives 4-bit select signals DLAT[3:0] and the W/R# control signal. Second mask latch 32 is logically partitioned into four entries 32A, 32B, 32C and 32D, with each entry storing 4 bits. The contents of entries 31A–31D in first mask latch 31 are routed to entries 32A–32D, respectively, in second mask latch 32. Second mask latch 32 also receives the SHIFT control signal from inverter 40.

Figure 4:
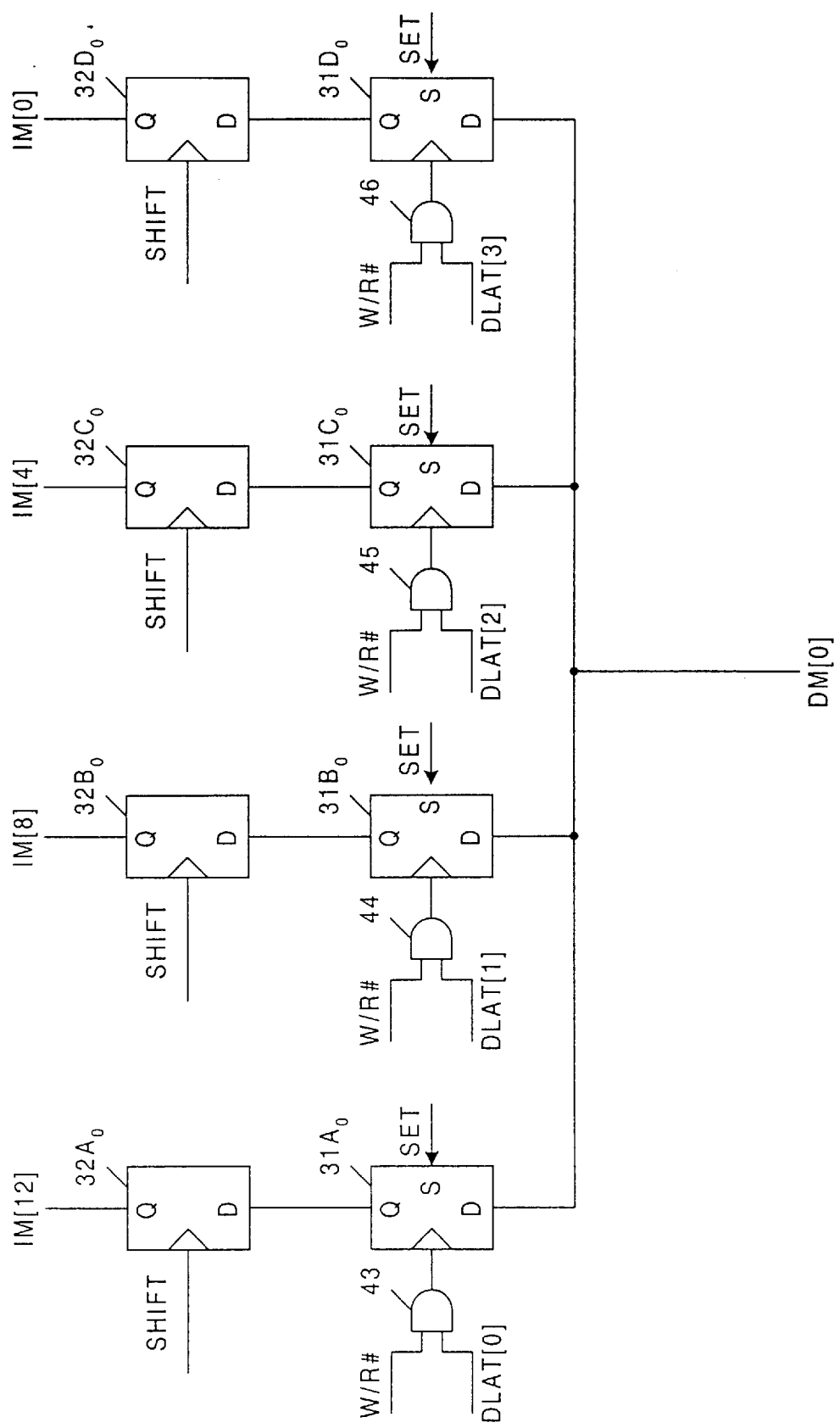
FIG. 4 is a schematic diagram illustrating bit slices of data mask entries of the write buffer of FIG. 2.

FIG. 4 is a schematic diagram illustrating a bit slice of each of entries 31A–31D and 32A–32D. These bit slices are formed by AND gates 43–46 and registers $31A_0$, $31B_0$, $31C_0$, $31D_0$, $32A_0$, $32B_0$, $32C_0$ and $32D_0$. Each of registers $31A_0$, $31B_0$, $31C_0$ and $31D_0$ is coupled to receive a mask bit (e.g., DM[0]) from I/O interface 101. Registers $31A_0$, $31B_0$, $31C_0$ and $31D_0$ are further coupled to receive latch enable signals from AND gates 43–46, respectively. Each of AND gates 43–46 has an input terminal coupled to receive the W/R# control signal. AND gates 43–46 also have input terminals coupled to receive data latch signals DLAT[0], DLAT[1], DLAT[2] and DLAT[3], respectively. The output terminals of registers $31A_0$, $31B_0$, $31C_0$ and $31D_0$ are coupled to the input terminals of registers $32A_0$, $32B_0$, $32C_0$ and $32D_0$, respectively. Data mask values are latched into registers $32A_0$, $32B_0$, $32C_0$ and $32D_0$ in response to the SHIFT signal. Registers $32A_0$, $32B_0$, $32C_0$ and $32D_0$ provide data mask output signals IM[12], IM[8], IM[4] and IM[0], respectively. The other bit slices in first and second mask latches 31 and 32 are connected in the same manner as the bit slices illustrated in FIG. 4. All of the registers in entry 31A are controlled by the control signal provided by AND gate 43. Similarly, all of the registers in entries 31B, 31C and 31D are controlled by the output signals provided by AND gates 44, 45 and 46, respectively.

At the same time that data values are being written to entries 11A, 11B, 11C and 11D of first data latch 11, corresponding data mask values are written to entries 31A, 31B, 31C and 31D, respectively of first data mask latch 31. The bits stored in data mask entries 31A–31D enable or disable corresponding bytes stored in data entries 11A–11D. For example, if data mask entry 31A stores bits "0000", then each of the four 8-bit bytes stored in corresponding data entry 11A is enabled. Conversely, if data mask entry 31A stores bits "1111", then each of the four 8-bit bytes stored in corresponding data entry 11A is disabled (i.e., masked). If entry data mask entry 31A stores bits "1110", then only one of the four 8-bit bytes stored in data entry 11A is enabled. At the beginning of each write transaction, W/R buffer control circuit 106 asserts a logic high SET signal, thereby causing all of the entries of first mask latch 31 to be set high. As a result, all of the bytes are initially masked. The masking operation is described in more detail below.

First address latch 21 is coupled to receive the address signal A[16:2] and the write control signal. The WRITE control signal is asserted high when the ADS# signal is detected low and the W/R# signal is detected high at a rising edge of the CLK signal. The WRITE control signal remains asserted high for the duration of a cycle of the CLK signal. Second address latch 22 is coupled to receive the contents of first address latch, as well as the shift control signal. The SHIFT control signal is generated by routing the WRITE control signal through inverter 40. Second address latch 22 provides internal address IA[16:2] as an output signal.

Figure 5:
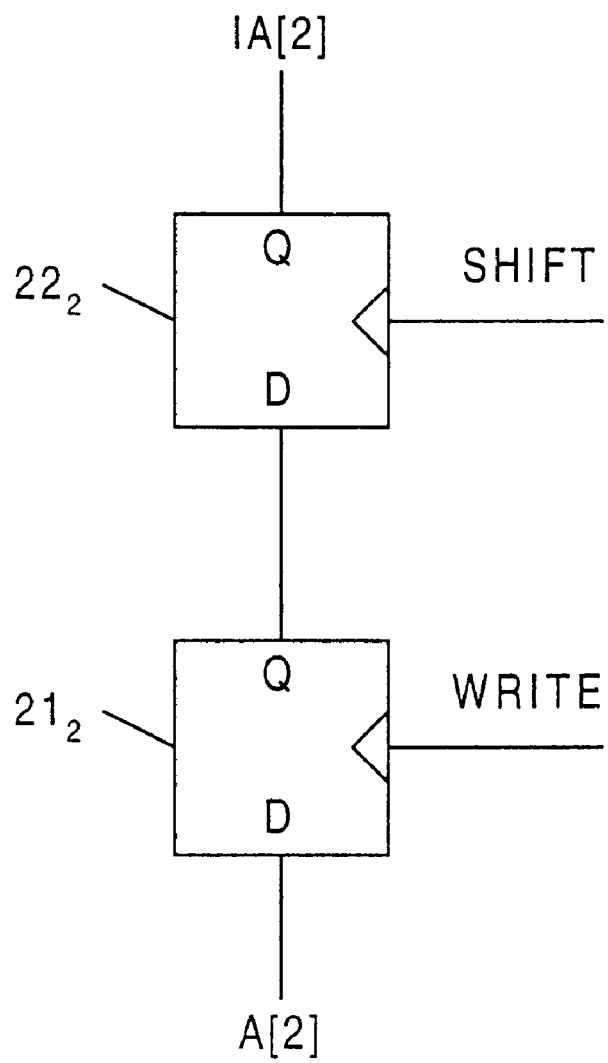
FIG. 5 is a schematic diagram of a bit slice of address entries of the write buffer of FIG. 2.

FIG. 5 is a schematic diagram of a bit slice of first address latch 21 and second address latch 22. This first bit slice includes registers $22_2$ and $22_2$. Register $21_2$ receives the address bit A[2], which is latched in response to the WRITE control signal. Register $22_2$ latches the output signal provided by register $21_2$ in response to the SHIFT control signal. Register $22_2$ provides the internal address bit IA[2]. At the same time that the first data value is written to first data latch 11, the address signals A[16:2] are written to first address latch 21.

To summarize, during a first data cycle, a 32-bit data value is written to one of the entries of the first data latch 11, a 4-bit data mask value is written to a corresponding entry of the first mask latch 31, and a corresponding address 15-bit address value is written to the first address latch 21. During a second subsequent cycle, a second 32-bit data value is written to a second entry of first data latch 11 and a second 4-bit mask value is written to a corresponding second entry of first mask latch 31. During third and fourth cycles, third and fourth data values are written to third and fourth entries of first data latch 11, the third and fourth data mask values are written to third and fourth entries of first mask latch 31. A write transaction can include from one to four of the above described cycles.

When the write transaction is complete, the information associated with the wire transaction is stored in first latch circuit 201, and the WRITE control signal has a logic low value. Under these conditions, the information stored in first latch circuit 201 is provided to second latch circuit 202, which is maintained in a transparent state in response to the logic high SHIFT control signal. When the WRITE control signal transition to a logic high state at the beginning of the next write transaction, the SHIFT control signal transitions to a logic low state, thereby causing the information stored in first latch circuit 201 to be latched in second latch circuit 202. At this time, new information concerning the next write transaction is written to first latch circuit 201 in the manner described above. Also at this time, the data stored in the second latch circuit 202 is retired to memory array 115.

Referring to FIG. 1, data is transferred from second latch circuit 202 to memory array 115 as follows. All of the data values stored in second data latch 12 are transmitted to write driver circuit 110. The internal data mask values IM[15:0] are transferred from second mask latch 32 to inverting input terminals of AND gate 111. The inverted internal data mask values IM[15:0] are logically ANDed with the WRITE control signal, and the resulting 16-bit value is provided to control write driver circuit 110. As previously described, each of the internal data mask values IM[15:0] corresponds with one of the 8-bit bytes included in output data values WDO[127:0]. Each of the internal data mask values that has a logic low value will cause AND gate 111 to provide a logic high output signal that enables write driver circuit 110 to drive the corresponding 8-bit byte onto the 128-bit internal data bus. Conversely, each of the internal data mask values that has a logic high value will cause AND gate 111 to provide a logic low output signal that disables write driver circuit 110 from driving the corresponding 8-bit byte onto the 128-bit internal data bus.

The internal write address IA[16:2] stored in second address latch 22 is routed to address multiplexer 113. Address multiplexer 113 routes this internal write address IA[16:2] to address decoder 114 in response to the logic high WRITE control signal and the logic low EA# signal. Address decoder 114 decodes the internal write address IA[16:2] and enables the appropriate row and column select signals in memory array 115.

Figure 6:
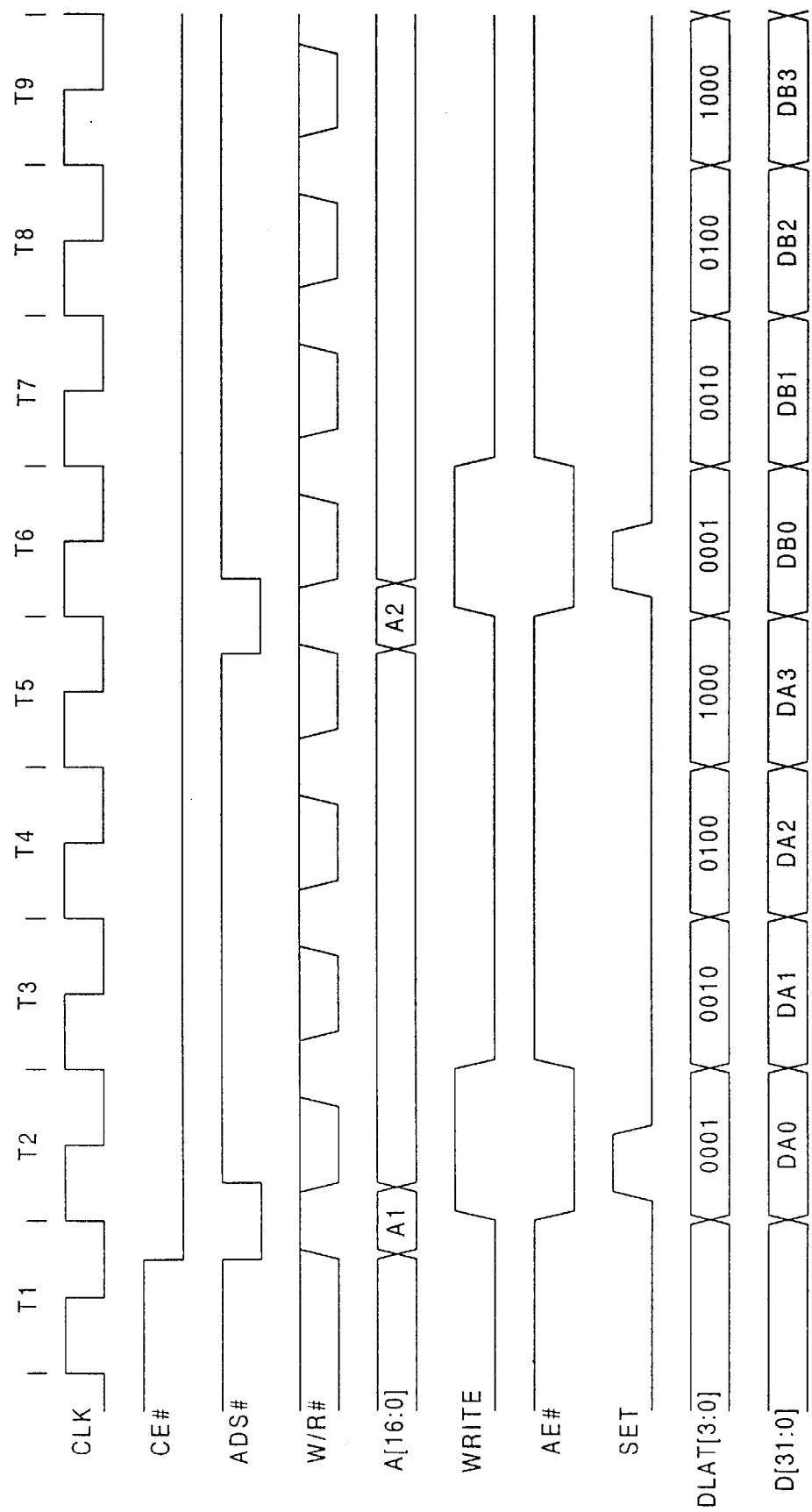
FIG. 6 is a waveform diagram illustrating two consecutive burst write operations in accordance with one embodiment of the invention.

FIG. 6 is a waveform diagram illustrating consecutive burst write operations. In the idle state, both the chip enable CE# and the ADS# signals are high and the ADS# signal is low. The WRITE control signal is activated high when the ADS# signal is low, the CLK signal is high and the W/R# signal is high, or when the HIT signal generated by comparator 105 is high. A write transaction is detected at the beginning of cycle T2 with CE# low, ADS# low and W/R# high. In response, the write control signal is activated high for the duration of cycle T2. The high state of the WRITE control signal causes the SHIFT signal to go low, setting the transparent latches in second latch circuit 202 in the latched state, and thus preserving the data, mask and address information of the previous write transaction. The high state of the WRITE control signal selects the address stored in the second address latch 22 to be gated to the address decoder 114 though address multiplexer 119. Activation of the WRITE control signal also selectively turns on tri-state write driver circuit 110, dependent on the values of internal mask value IM[15:0]. The data WDO[127:0] stored in second data latch 12 is thus selectively written to memory array 115.

Upon detecting the rising-edge of the WRITE control signal, W/R buffer control circuit 106 causes the SET signal to go high for a duration of a half clock-cycle. The activation of the SET signal sets the contents of first mask latch 31 to logic high values. This ensures that logic high mask bits are provided for all associated entries within first data latch 11 that do not receive data values. While data of the previous write transaction is being retired, new data, mask and address value from the new transaction can be written to the first latch circuit 201 of write buffer 103.

By cycle T3, the write retiring process is completed and W/R buffer control circuit 106 drives the WRITE control signal low, thereby causing the SHIFT signal to go high. At this time, second latch circuit 202 becomes transparent again. FIG. 6 shows the timing of two write transactions with burst length of 4. Thus, data values are written to write buffer 103 during cycles T3, T4 and T5. However, because memory array 115 is not being accessed during cycles T3, T4 and T5, refresh operations can be performed during this time. Note that the EA# signal is asserted low for one cycle at the beginning of each write transaction. After the first cycle of the write transaction, the EA# signal is de-asserted high, thereby allowing any pending refresh operations to be performed.

Transactions of shorter burst lengths will have timing similar to the timing illustrated in FIG. 6. However, in these transactions, fewer clock cycles will exist between the activation of the WRITE control signal. Successive write transactions can have different burst lengths. For example, the first transaction can be a non-burst transaction having a length of one cycle, and the second transaction can have a burst length of three cycles.

Read Buffer

Figure 7:
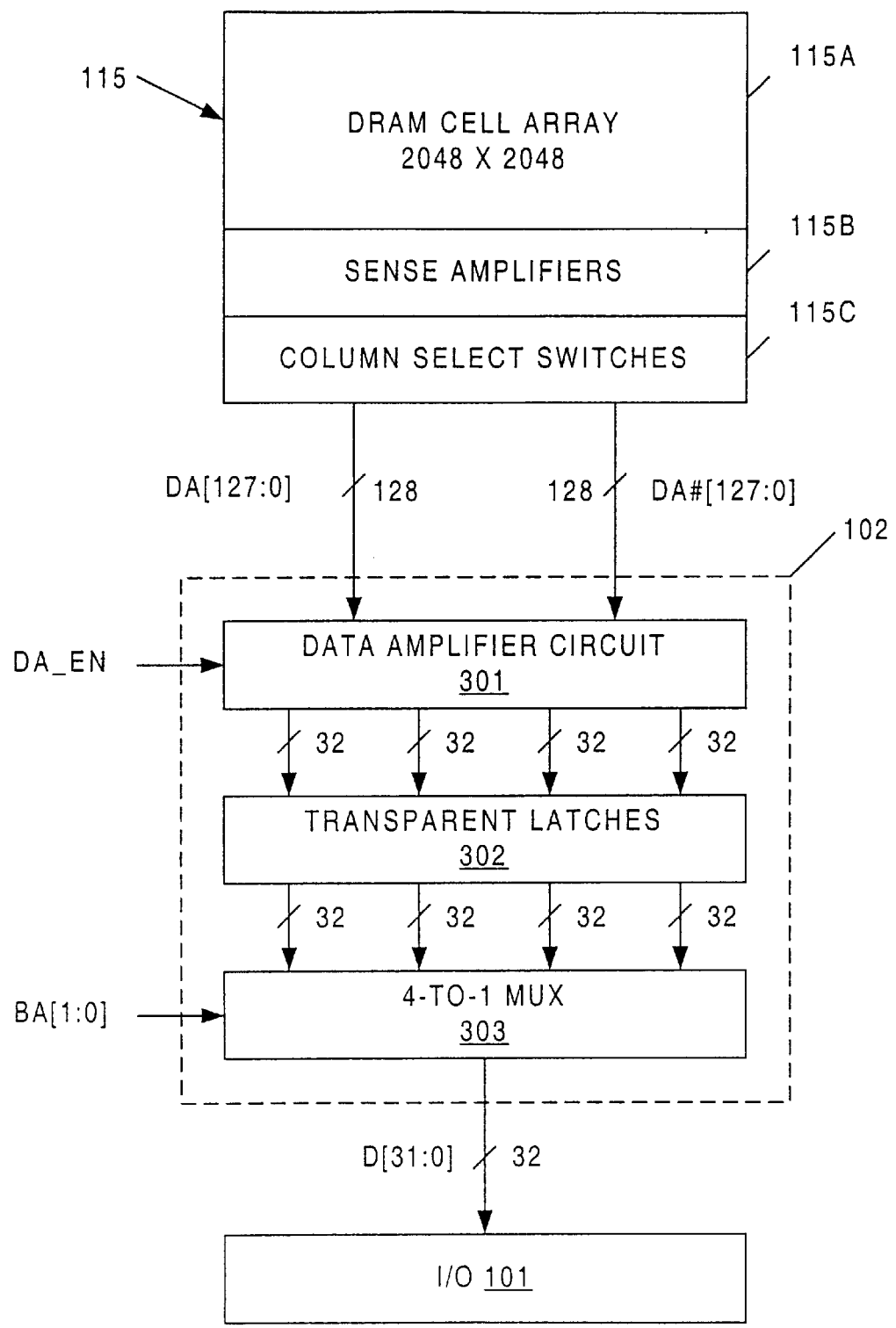
FIG. 7 is a block diagram of a read buffer, I/O interface and memory array in accordance with one embodiment of the present invention.

FIG. 7 is a block diagram of read buffer 102, I/O interface 101 and memory array 115. As described above, memory array 115 includes a 2048×2048 array of memory cells 115A. Each of the 2048 columns is coupled to a corresponding sense amplifier in sense amplifier circuit 115B. The sense amplifiers 115B are coupled to column select switches 115C, which selectively route 128 of the 2048 data values to read buffer 102 in response to column select signals provided by address decoder 114. The 128 data values are routed to read buffer 102 as data signals DA[127:0] and complementary data signals DA#[127:0]. These 128 data values from four 32-bit words.

Read buffer 102 includes data amplifier circuit 301, transparent latch circuit 302, and 4-to-1 multiplexer 303. Data amplifier circuit 301 includes 128 data amplifiers, and transparent latch circuit 302 includes 128 corresponding transparent latches. The DA_EN signal is asserted high for one cycle upon detecting a read operation. When the DA_EN signal is asserted high, the 128 data bits received from memory array 115 are simultaneously latched into data amplifier circuit 301 and transparent latch circuit 302 during a single cycle. When the DA_EN signal is de-asserted low after one cycle, data amplifier circuit 301 is isolated from transparent latch circuit 302. At this time, the 128 data bits are stored in transparent latch circuit 302. Multiplexer 303 is controlled to selectively route 32 of these 128 data bits from transparent latch circuit 302 to I/O interface 101 as a data word D[31:0] during each memory cycle. Thus, multiplexer 303 routes four 32-bit words to I/O interface 101 over four memory cycles. Multiplexer 303 is controlled by burst address signals BA[1:0]. Burst address signals BA[1:0] are generated by burst access sequencer 109 in response to the address signals A[1:0], the TR control signal and the ADS# signal. The sequence of burst address signals BA[1:0] is determined in response to address signals A[1:0] in a manner known in the art.

Figure 8:
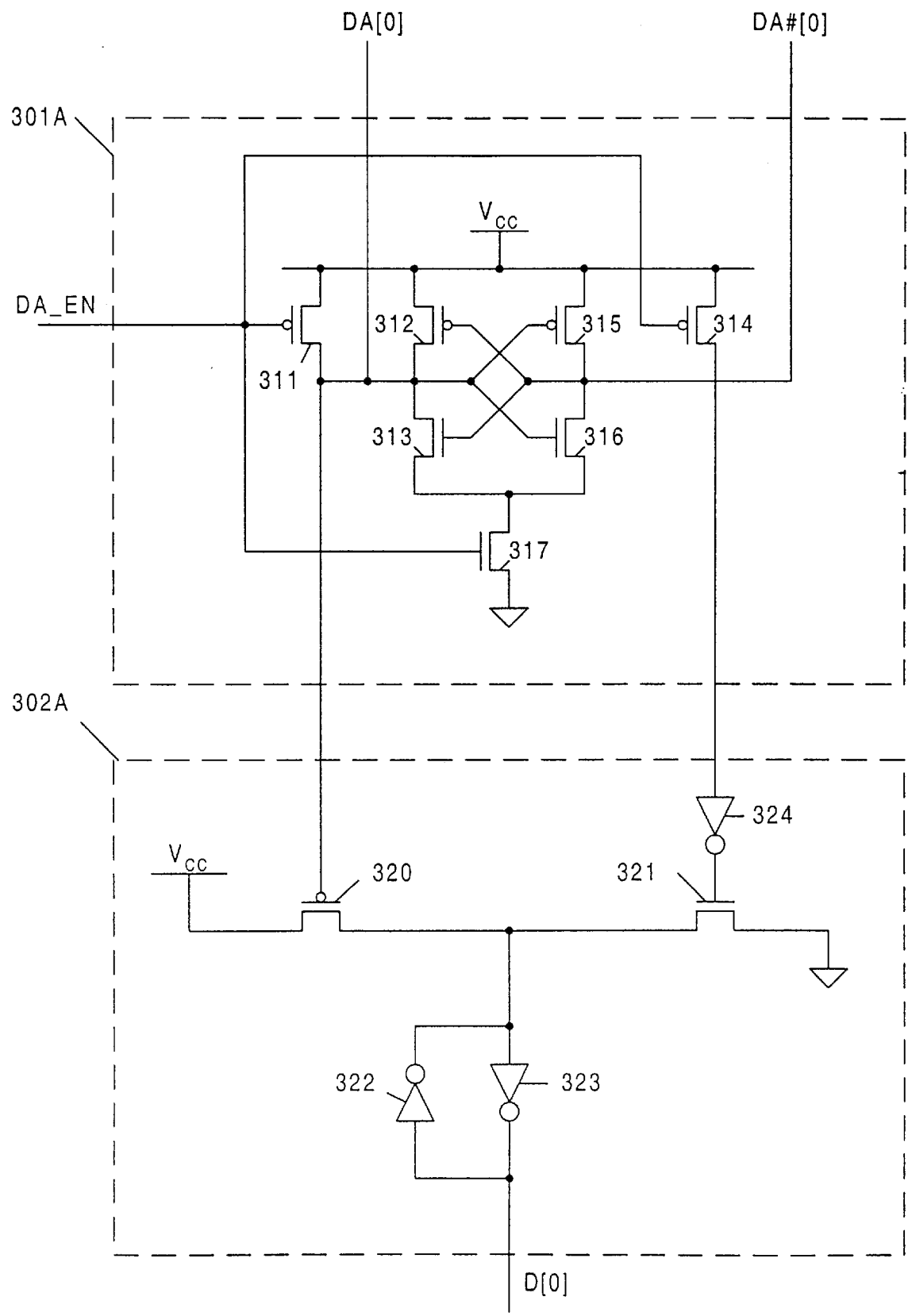
FIG. 8 is a schematic diagram of a bit slice of a data amplifier circuit and a transparent latch circuit of a read buffer in accordance with one embodiment of the present invention.

FIG. 8 is a schematic diagram of a bit slice of data amplifier circuit 301 and transparent latch circuit 302 in accordance with one embodiment of the present invention. This bit slice includes data amplifier 301A and transparent latch 302A. Data amplifier 301A includes a regenerative latch formed by transistors 312, 313, 315, and 316. Data amplifier 301A also includes control transistors 311, 314 and 317, which are coupled to receive the DA_EN signal. Prior to a read operation, the DA_EN signal is de-asserted low, thereby turning on p-channel transistors 311 and 314 to pre-charge the differential input signals DA[0] and DA# [0] to a logic high level. During a read operation, DA_EN is asserted high, thereby turning off transistors 311 and 314 and turning on transistor 317. Turning on transistor 317 activates the regenerative latch formed by transistors 312–313 and 315–316. The activated regenerative latch amplifies the applied data signals DA[0] and DA#[0]. The amplified data signals DA[0] and DA#[0] are applied to transistors 320 and 321, respectively, thereby causing the data value DA[0] to be latched into cross coupled inverters 322–323 and provided as data signal D[0].

During the read operation, one of the signals DA[0] or DA#[0] will have a logic low value, thereby causing transparent latch 302A to enter a transparent state. If DA[0] is low and DA#[0] is high, then transistor 320 is turned on, thereby providing a logic high signal to the input terminal of the regenerative latch formed by inverters 323 and 322. In response, inverter 323 drives the output data signal D[0]low.

Conversely, if DA#[0] is low and DA[0] is high, then inverter 324 provides a logic high signal to turn on transistor 321, thereby pulling down the input signal to inverter 323. As a result, inverter 323 drives the output data signal D[0] high.

After the read operation is completed, the DA_EN signal transitions to a logic low state, thereby turning on p-channel transistors 311 and 314 and pre-charging the DA[0] and DA#[0] signals high. The logic high DA[0] and DA#[0] signals cause both transistors 320 and 321 to turn off, thereby causing transparent latch 302A to enter a latched state.

Figure 9:
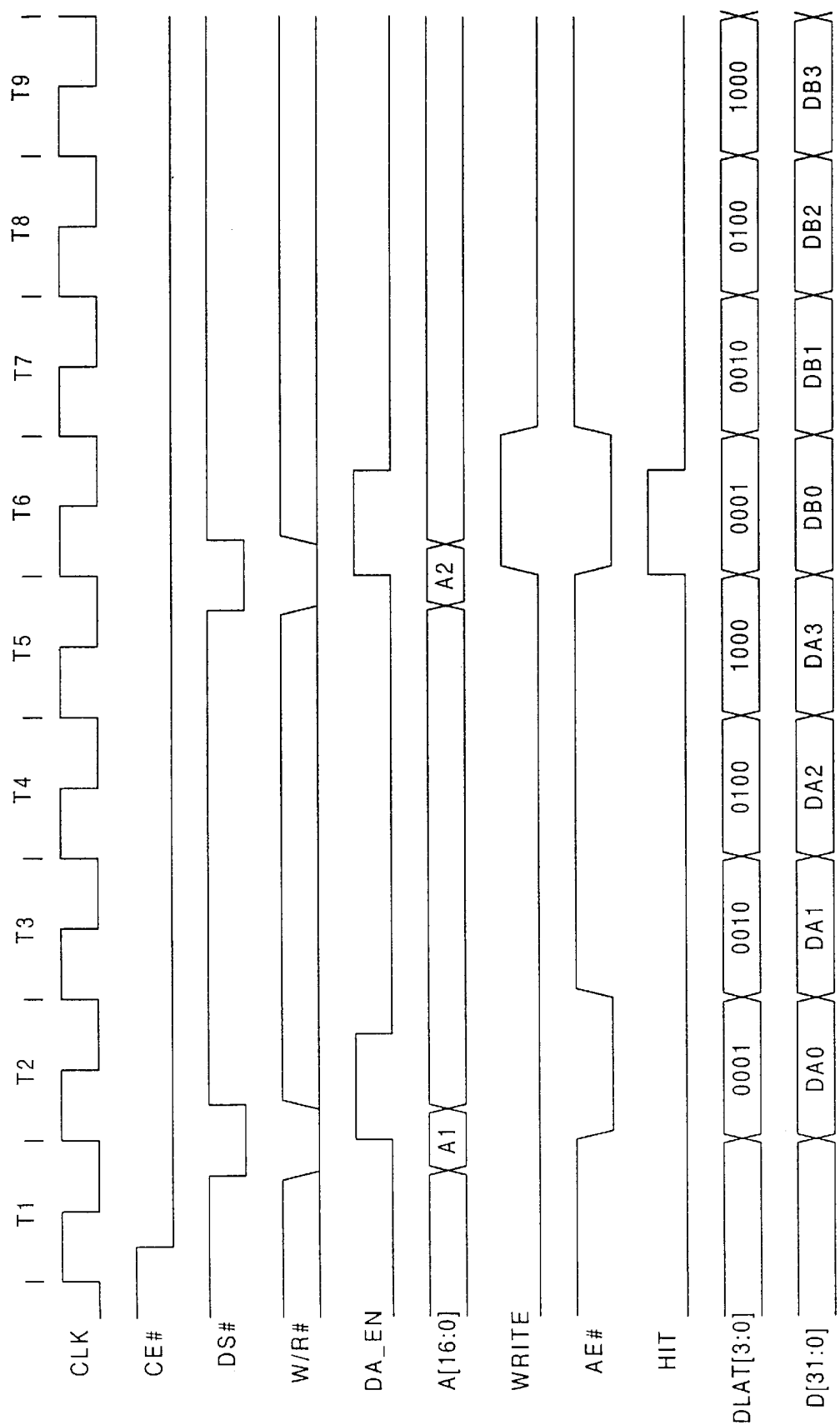
FIG. 9 is a waveform diagram illustrating two consecutive burst read operations in accordance with one embodiment of the present invention.

FIG. 9 is a waveform diagram illustrating two burst read operations that access addresses A1 and A2. When read transactions are detected at the beginning of cycles T1 and T5 (CE#low, ADS# low and W/R# low), the DA_EN signal is driven high by W/R buffer controller 106. Access arbiter 107 also drives the EA# signal low for once cycle at the beginning of cycles T1 and T5. Data amplifier circuit 301 is activated in response to the logic high DA_EN signal, and amplifies the applied data signals DA[127:0] and DA#[127:0]. During this time, transparent latch 302 is in the transparent state and drives the data values DA[127:0] as output data signals D[127:0]. W/R buffer control circuit 106 asserts the DA_EN signal for approximately a half clock-cycle. When the DA_EN is de-asserted, the applied data values DA[127.0] and DA#[127.0] are driven high and the data values DA[127:0] are latched in transparent latch 302.

During the next three cycles, data values are routed from transparent latch circuit 302, through 4-to-1 multiplexer 303, to I/O interface 101. At this time, the EA# signal is de-asserted high to indicate that refresh operations can be performed within memory array 115 during these three cycles (because memory array 115 is not being accessed during this time).

Without further modification, the data stored in write buffer 103 may result in data coherence problems. That is, a data coherence problem will exist if a read operation attempts to read data that has been written to write buffer 103, but not yet retired to memory array 115. To ensure data coherence, at the beginning of a read transaction, address comparator 105 compares the current access address A[16:2] with the internal write address IA[16:2] provided by write buffer 103 (i.e., the write tag address). If these addresses do not match, as in read transaction A1, then the HIT control signal provided by comparator 105 remains low. However, if these addresses match, as in read transaction A2, then comparator 105 drives the HIT control signal high. The activation of the HIT control signal indicates that some of the data required by read transaction A2 is stored in write buffer 103. Upon receiving the logic high HIT signal, W/R buffer control circuit 106 asserts the WRITE control signal high. As a result, AND gate 111 is enabled to selectively route the data mask values IM[15:0] to write driver circuit 110. This causes any newly written data stored in the second data latch of write buffer 103 to be selectively routed through write driver circuit 110 to the 128-bit internal data bus. At the same time, the desired read operation is performed within memory array 115. As a result, write driver circuit 110 and memory array 115 simultaneously drive the 128-bit data bus. Any bits driven by write driver circuit 110 override the corresponding bits driven by memory array 115, thereby merging the data provided by write driver circuit 110 with the data provided by memory array 115. Consequently, coherent data is provided to read buffer 102.

Although the invention has been described in connection with several embodiments, it is understood that this invention is not limited to the embodiments disclosed, but is capable of various modifications which would be apparent to a person skilled in the art. For example, memory array 115 can have different sizes in different embodiments. Thus, the invention is limited only by the following claims.

I claim:

1. A memory system comprising:
   an input/output (I/O) interface coupled to receive external signals for accessing the memory system;
   a memory cell array having memory cells that must be periodically refreshed;
   a write buffer coupled to receive and store a plurality of burst white data values from the I/O interface over a plurality of memory cycles, and retire the plurality of burst write data values to the memory cell array during a single memory cycle;
   a refresh controller configured to assert a refresh request signal independent of the external signals; and
   an access arbiter coupled to the I/O interface and the refresh controller, the access arbiter being configured to assert an internal refresh signal in response to the refresh request signal and one or more of the external signals, the asserted internal refresh causing the memory cell array to be refreshed during a single memory cycle during the time that the write buffer is receiving, but not retiring, burst write data values.

2. The memory system of claim 1, wherein the memory cells are dynamic random access memory (DRAM) cells.

3. The memory system of claim 1, wherein the write buffer has a cascade structure.

4. The memory system of claim 1, further including circuitry for retiring burst write data values associated with a first write transaction upon detecting a subsequent write transaction.

5. The memory system of claim 1, further comprising a read buffer coupled to the memory cell array, the read buffer receiving and storing a plurality of burst read data values from the memory cell array during a single memory cycle, and outputting the burst read data values over a plurality of memory cycles, wherein the access arbiter asserts the internal refresh signal to refresh the memory cell array during a single memory cycle during the time that the read buffer is outputting, but not receiving, the burst read data values.

6. The memory system of claim 1, wherein the write buffer comprises a write address memory circuit for storing a write address associated with the burst write data values received and stored by the write buffer.

7. The memory system of claim 6, further comprising a comparator that comprises a current read address with the write address stored in the write address memory circuit.

8. The memory system of claim 7, further comprising circuitry for retiring the burst write data values stored by the write buffer when the current read address matches the write address stored in the write address memory circuit.

9. The memory system of claim 8, further comprising circuitry for merging the burst write data values with read data values read from the memory cell array in response to the current read address.

10. A memory system comprising:
    an input/output (I/O) interface coupled to receive external signals for accessing the memory system;

a memory cell array having memory cells that must be periodically refreshed;

a read buffer coupled to receive and store a plurality of burst read data from the memory cell array during a single memory cycle, and output the burst read data values to the I/O interface over a plurality of memory cycles;

a refresh controller configured to assert a refresh request signal independent of the external signals; and an access arbiter coupled to the I/O interface and the refresh controller, the access arbiter being configured to assert an internal refresh signal in response to the refresh request signal and one or more of the external signals, the asserted internal refresh causing the memory cell array to be refreshed during a single memory cycle during the time that the read buffer is outputting, but not receiving, the burst read data values.

11. A method of operating a memory system having a memory cell array that must be periodically refreshed, the method comprising the steps of:

receiving external signals for accessing the memory cell array;

sequentially writing a first plurality of write burst data values to a write buffer over a first plurality of memory cycles in response to the external signals;

retiring a second plurality of write burst data values to the memory cell array from the write buffer during a first memory cycle, wherein the first memory cycle coincides with one of the first plurality of memory cycles;

asserting a refresh request signal independent of the external signals;

asserting an internal refresh signal in response to the refresh request signal and one or more of the external signals; and refreshing the memory cell array in response to the internal refresh signal during a single memory cycle of the first plurality of memory cycles, other than the first memory cycle.

12. The method of claim 11, wherein the internal refresh signal is only asserted when there is no external memory access to the memory cell array.

13. The method of claim 11, further comprising the steps of:

reading a plurality of read burst data values from the memory cell array and storing the read burst data values in a read buffer during a second memory cycle;

sequentially reading the burst read data values from the read buffer over a second plurality of memory cycles, wherein the second memory cycle coincides with one of the second plurality of memory cycles;

asserting a refresh request signal independent of the external signals;

asserting an internal refresh signal in response to the refresh request signal and one or more of the external signals; and refreshing memory cell array in response to the asserted internal refresh signal during a single memory cycle of the second plurality of memory cycles, other than the second memory cycle.

14. The method of claim 11, further comprising the step of retiring burst write data values associated with a first write transaction to the memory cell array upon detecting a subsequent write transaction.

15. The method of claim 11, further comprising the step of storing a write tag address associated with the burst write data values written to the write buffer.

16. The method of claim 15, further comprising the step of comparing a current read address with the write tag address.

17. The method of claim 16, further comprising the step of retiring the burst write data values to the memory cell array from the write buffer when the current read address matches the write tag address.

18. The method of claim 17, further comprising the step of merging the burst write data values with read data values read from the memory cell array in response to the current read address.

19. A method of operating a memory system having a memory cell array that must be periodically refreshed, the method comprising the steps of:

receiving external signals for accessing the memory cell array;

reading a plurality of read burst data values from the memory cell array and storing the read burst data values in a read buffer during a first memory cycle in response to the external signals;

sequentially reading the burst read data values from the read buffer over a first plurality of memory cycles, wherein the first memory cycle coincides with one of the first plurality of memory cycles;

asserting a refresh request signal independent of the external signals;

asserting an internal refresh signal in response to the refresh request signal and one or more of the external signals; and refreshing memory cell array in response to the asserted internal refresh signal during a single memory cycle of the first plurality of memory cycles, other than the first memory cycle.

20. The method of claim 19, wherein the internal refresh signal is only asserted when there is no external memory access to the memory cell array.

* * * * *

UNITED STATES PATENT AND TRADEMARK OFFICE
CERTIFICATE OF CORRECTION

PATENT NO. : 6,256,248 B1
DATED : July 3, 2001
INVENTOR(S) : Wingyu Leung

It is certified that error appears in the above-identified patent and that said Letters Patent is hereby corrected as shown below:

Column 6,
Line 13, "bust" should be changed to -- burst --

Column 8,
Line 37, first occurrence of "$22_2$" should be changed to -- $21_2$ --

Column 9,
Line 47, "119" should be changed to -- 113 --

Signed and Sealed this

Nineteenth Day of November, 2002

Attest:

JAMES E. ROGAN
Attesting Officer   Director of the United States Patent and Trademark Office